United States Patent [19]

Suwanai et al.

[11] Patent Number: 5,025,741
[45] Date of Patent: Jun. 25, 1991

[54] METHOD OF MAKING SEMICONDUCTOR INTEGRATED CIRCUIT DEVICE WITH POLYSILICON CONTACTS

[75] Inventors: Naokatsu Suwanai, Koganei; Osamu Tsuchiya, Ohme, both of Japan

[73] Assignee: Hitachi, Ltd., Tokyo, Japan

[21] Appl. No.: 344,404

[22] Filed: Apr. 28, 1989

[30] Foreign Application Priority Data

May 2, 1988 [JP] Japan .................. 63-109781

[51] Int. Cl.⁵ .................. H01L 21/70
[52] U.S. Cl. .................. 437/52; 437/47; 437/60; 437/191; 437/228; 437/233; 437/235; 437/918; 437/919
[58] Field of Search .............. 437/29, 40, 41, 56, 437/57, 59, 200, 189, 191, 193, 918, 228, 233, 235, 60, 919, 47, 51, 52; 357/59 H, 23.6, 51, 40

[56] References Cited

U.S. PATENT DOCUMENTS 4,063,967 12/1987 Graul et al. .................. 437/193
4,348,802 9/1982 Shirato .................. 437/193
4,433,468 2/1984 Kawamata .................. 437/193
4,796,081 1/1989 Cheung et al. .................. 437/189

Primary Examiner—Brian E. Hearn
Assistant Examiner—T. Thomas
Attorney, Agent, or Firm—Antonelli, Terry, Stout & Kraus

[57] ABSTRACT

A semiconductor integrated circuit device having a wiring line of aluminum film or aluminum alloy film covered with a silicon insulation film and connected to the semiconductor region formed on the principal surface of a single crystal silicon substrate, with a polycrystalline silicon film interposed, wherein said silicon film is a polycrystalline silicon film composed of large crystal grains which is formed by depositing in amorphous state and then heat-treating the deposited film, said polycrystalline silicon film reduces the amount of silicon atoms which separates out in said wiring line. Also said wiring line is provided with a shielding film which is disposed between said insulation film and at least the upper surface and lower surface of said wiring line and which prevents silicon atoms from separating out from said insulation film.

A process for manufacturing a semiconductor integrated circuit device which comprises the steps of depositing an amorphous silicon film on the principal surface of said semiconductor region, and performing heat treatment on said silicon film, thereby converting the amorphous silicon film into a polycrystalline silicon film composed of large crystal grains.

30 Claims, 5 Drawing Sheets

METHOD OF MAKING SEMICONDUCTOR INTEGRATED CIRCUIT DEVICE WITH POLYSILICON CONTACTS

BACKGROUND OF THE INVENTION

The present invention relates to a semiconductor integrated circuit device, and more particularly to a semiconductor integrated circuit device in which the wiring line is connected to the semiconductor region, with a silicon film interposed.

The memory cell of DRAM (Dynamic Random Access Memory) is made up of a MISFET (Metal-Insulator-Semiconductor-Field Effect Transistor) for memory cell selection and a capacitor element for information storage connected in series to the other semiconductor (source or drain) region. To the other semiconductor (source or drain) region of the MISFET for memory cell selection is connected a data line, which is formed by an aluminum alloy film incorporated with silicon (Si). This silicon prevents the so-called alloy spiking which results from the connection between the semiconductor region (single crystal silicon) and the data line.

Two memory cells arranged at the position to which the data line is extended is constructed integrally with (or own in common) the other semiconductor regions of the individual MISFETs for memory cell selection. In other words, the area corresponding to the field insulation film to insulate and separate the other semiconductor region is eliminated, so that DRAM has a higher degree of integration.

The present inventors are developing a high-integrated DRAM in which the data line is connected to the other semiconductor region of the MISFET for memory cell selection through an intermediate conductive film. This intermediate conductive film is made of polycrystalline silicon film formed by the CVD process (Chemical Vapor Deposition) at the temperature about 630°–650° C. This polycrystalline silicon film is doped with an impurity such as phosphorus (P) and arsenic (As) for the reduction of its resistance.

One end of the intermediate conductive film is connected to the other semiconductor region, in the region defined by the side wall spacer formed on the side wall of the gate electrode of MISFET for memory cell selection, self-aligned to said gate electrode. The other end of the intermediate conductive film extends to the upper part of the gate electrode along the side wall spacer, with the gate electrode electrically separated. The data line is connected to the intermediate conductive film through the connecting hole formed in the first interlayer insulation film of the upper layer of the intermediate conductive film. On the top of the data line is formed the second interlayer insulation film. The first interlayer insulation film and second interlayer insulation film are made of silicon-based insulation film such as silicon oxide film and silicon nitride film.

The DRAM constructed as mentioned above has an advantage that the displacements of the mask for the other semiconductor region of MISFET for memory cell selection and the mask for the data line from the desired locations can be absorbed by the intermediate conductive film in the course of production. In other words, the intermediate conductive film permits the area of the other semiconductor region of MISFET for memory cell selection to be reduced in size as much as the amount of mask placement errors. This leads to an advantage that the area of memory cell can be reduced and hence the degree of integration for DRAM can be increased.

Also, the technology for connecting the wiring line to the semiconductor region, with a silicon film interposed, is described in, for example, Japanese Journal of Applied Physics, Vol. 18, p. 35–42, 1979.

SUMMARY OF THE INVENTION

The present inventors investigated this type of DRAM. As the result, it was found that silicon separates out with elapse of time in the data line in the vicinity of the connection between the intermediate conductive film and the data line. The silicon precipitation reduces the sectional area of the data line, thereby increasing the resistance of the data line or apparently disrupting the data line. This considerably deteriorates the electrical reliability of DRAM.

As the result of extensive studies, the present inventors found that silicon separates out in different amounts depending on the crystal state in the intermediate conductive film. The CVD-process to form polycrystalline silicon film is usually accomplished at 630°–650° C. The CVD process at this temperature provides an intermediate conductive film of polycrystalline silicon having a grain size smaller than about 0.1 μm. In such an intermediate conductive film, the grain boundary has unstable energy, and silicon atoms in the intermediate conductive film is liable to dissolve in the data line (aluminum film). In other words, a substitution reaction takes place between silicon atoms in the intermediate conductive film and aluminum atoms in the data line. The silicon atoms which have been dissolved by the substitution reaction cause silicon to separate out, nucleating the silicon atoms added to the aluminum film.

In the meantime, the DRAM under development by the present inventors has a data line formed by putting a film of refractory metal silicide (such as $MoSi_2$ and $WSi_2$) and a film of aluminum alloy in layers. This composite film is used as a signal wiring line in the peripheral circuit for the DRAM, and this signal wiring line is connected directly to the semiconductor region without intermediate conductive film placed between them. The lower layer of refractory metal silicide is constructed such that no epitaxial layer grows on the surface in the semiconductor region at the connection between the signal wiring line and the semiconductor region, and that the resistance at the connection between the two is reduced. The peripheral circuit of the DRAM employs larger MISFETs than the MISFETs for memory cell selection because of their driving power. Therefore, the peripheral circuit needs not intermediate conductive film and employs no intermediate conductive film for improved yields in production.

The present inventors investigated the distribution of silicon precipitation in the data line in the DRAM. It was found that silicon separates out on (surface) or in the data line at the part opposite to the refractory metal silicide film. The silicon oxide film (the second interlayer insulation film) deposited by the CVD process is in direct contact with the top of the data line. There is a great possibility that the silicon oxide film deposited by the plasma CVD process contains an amount of unreacted silicon atoms. The present inventors, therefore, consider that these unreacted silicon atoms become the nuclei of the silicon which separates out.

It is a object of the present invention to provide a technology which makes it possible to reduce the amount of silicon which separates out in the wiring line in the semiconductor integrated circuit device in which the wiring line is connected to the semiconductor region through a silicon film (intermediate conductive layer), thereby improving the electrical reliability of the device.

It is another object of the present invention to provide a technology for achieving the above-mentioned object without increasing the number of production steps.

The above and further objects and novel features of the invention will more fully appear from the following detailed description and the accompanying drawings.

The major scopes of the invention disclosed in the present application are briefly explained in the following.

(1) A semiconductor integrated circuit device having the wiring line covered with silicon insulation film and connected to the semiconductor region through a silicon film, in which a shielding film is formed on at least the lower surface and upper surface of said wiring line in order to shield silicon atoms in said insulation film.

(2) In addition to the construction mentioned in (1) above, said silicon film is deposited in the amorphous state, and subsequently said silicon film is heat-treated to form a polycrystalline silicon film.

(3) A semiconductor integrated circuit device having the wiring line connected to the semiconductor region through a silicon film, in which said silicon film is formed by depositing in the amorphous state and subsequently it is converted into polycrystalline silicon film by heat-treatment, with the grain size increased.

(4) A semiconductor integrated circuit device in which the wiring line is connected to the semiconductor region through a silicon film, in which said silicon film is formed by CVD method at a temperature lower than 600° C., and said silicon film has the polycrystalline structure formed by heat treatment.

(5) A semiconductor integrated circuit device having a silicon film interposed between the semiconductor region and the wiring line in the first region and a resistance element in the second region, in which said silicon film is deposited in amorphous state in the first and second regions, and the silicon film in the first region is made polycrystalline by the treatment to reduce resistance and the silicon film in the second region forms a resistance element.

BRIEF DESCRIPTION OF THE DRAWINGS

To avoid unnecessary repetition, like reference characters designate corresponding parts throughout the drawings.

DESCRIPTION OF THE PREFERRED EMBODIMENTS

Embodiment 1

Figure 1:
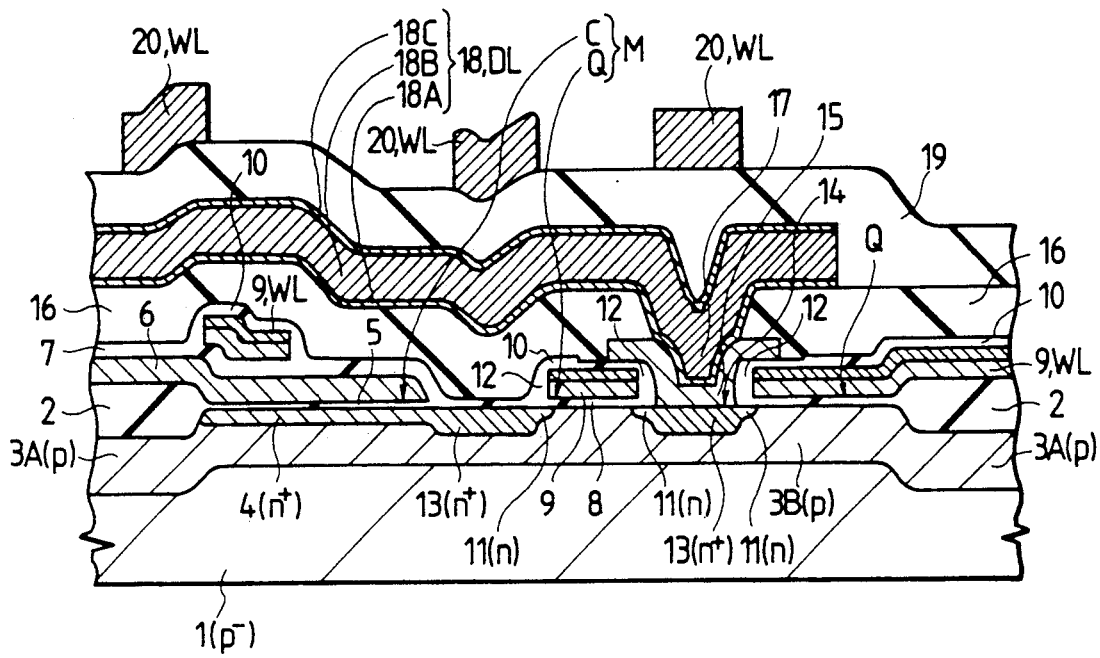
FIG. 1 is a main part sectional view of a semiconductor integrated circuit device containing the memory cell of DRAM in Embodiment 1 of the invention.

This Embodiment is concerned with the memory cell of a DRAM, the construction and major parts of which are shown in section in FIG. 1.

The DRAM is based on the folded bit line architecture. It has the memory cell array (memory cell mat) in which a plurality of memory cells M as shown in FIG. 1 are arranged in a matrix. The DRAM is constructed on a p-type semiconductor substrate (or well region) 1 which is made of single crystal silicon. The DRAM has the peripheral circuit such as a decoder circuit (not shown) based on CMOS (Complementary Metal-Oxide-Semiconductor).

The memory cell M is constructed on the principal surface of the p-type potential barrier region 3B in the region defined (surrounded) by the field insulation film 2 and p-type channel stopper region 3A.

The field insulation film 2 is a thick silicon oxide film formed by the selective oxidation of the principal surface of the semiconductor substrate 1. The channel stopper region 3A is formed under the field insulation film and on the principal surface of the semiconductor substrate 1. The field insulation film 2 and the channel stopper region 3A are constructed such that the memory cells M are electrically separated.

The potential barrier region 3B is formed beneath the entire surface of the memory cell M or all over the memory array on the principal surface of the semiconductor substrate 1. Basically, the potential barrier region 3B should be formed beneath at least the capacitor element C for information storage of the memory cell M. The potential barrier region 3B constitutes a potential barrier for minority carriers which are evolved when α-rays enter the semiconductor substrate 1. In other words, the potential barrier region 3B prevents minority carriers from changing the charge storage amount in the capacitor element C for information storage, thereby reducing the rate of occurrence of soft errors in the memory cell mode. The potential barrier region 3B is so constructed as to increase the amount of charge storage in the capacitor cell C for information storage. This potential barrier region 3B is formed in the same manufacturing step as for the channel stopper region 3A. The p-type channel stopper region which defines the region of a MISFET constituting the peripheral circuit such as a decoder circuit, is formed in substantially the same manufacturing step as for the field insulation film 2 and formed in the manufacturing step which is different from that for the channel stopper region 3A. The potential barrier region 3B and channel stopper region 3A can be formed by introducing a p-type impurity by ion implantation before or after the formation of the field insulation film 2, and then stretching and diffusing this p-type impurity.

The memory cell M is made up of the MISFET Q for memory cell selection and the capacitor element C for information storage connected in series.

The capacitor element C for information storage is formed by putting the $n^+$-type semiconductor region 4 (which is one of the electrodes or the lower electrode), the dielectric film 5, and the plate electrode 6 (which is the other electrode or the upper electrode) on top of the other. In other words, the capacitor element C for information storage has the planar structure.

To the plate electrode 6 is applied a source voltage of ½ $V_{cc}$. The source voltage ½ $V_{cc}$ is an intermediate voltage (which is about 2.5 V) of the source voltage $V_{cc}$ (which is the operating potential 5 V of the circuit) and the ground potential 0 V of the circuit. Since the source voltage ½ $V_{cc}$ can reduce the electric field strength between the semiconductor region 4 and the plate electrode 6, it is possible to reduce the thickness of the dielectric film 5 and increase the quantity of charge storage in the capacitor element C for information storage. The plate electrode 6 is made of polycrystalline silicon film into which an n-type impurity (As or P) is introduced to reduce resistance.

The semiconductor region 4 is constructed such that a potential as information from the data line (DL) 18 is applied through the MISFET Q for memory cell selection. The semiconductor region 4 is constructed such that the charge as information is certainly stored even when the source voltage ½ $V_{cc}$ is applied to the plate electrode 6. The semiConductor region 4 is formed by introducing an impurity (As or P in an amount of $1 \times 10^{14} \sim 1 \times 10^{15}$ atoms/cm$^3$) by ion implantation with energy of 100~150 keV.

The dielectric film 5 is a silicon oxide film formed by oxidizing the surface of the semiconductor region 4. The dielectric film 5 may also be a composite film composed of a silicon oxide film and a silicon nitride film.

The capacitor element C for information storage is basically made up of the semiconductor region 4, the dielectric film 5, and the plate electrode 6 as mentioned above. The pn-junction capacity between the semiconductor region 4 and the potential barrier region 3B contributes to the increase of charge storage.

On the surface of the plate electrode 6 of the capacitor element C for information storage is formed the interlayer insulation film 7 which electrically separates the upper conductive layer 9.

The MISFET Q for memory cell selection in the memory cell M is formed on the principal surface of the potential barrier region 3B. The MISFET Q for memory cell selection is formed in the region defined by the field insulation film 2 and the channel stopper region 3A. The MISFET Q for memory cell selection is composed of the potential barrier region 3B, the gate insulation film 8, the gate electrode 9, the n-type semiconductor regions 11 in a pair and the n+-type semiconductor regions 13 in a pair which are the source region and drain region.

The potential barrier region 3B is used as the channel forming region of the MISFET Q for memory cell selection.

The gate insulation film 8 is a silicon oxide film formed by oxidizing the principal surface of the potential barrier region 3B.

The gate electrode 9 is formed on the gate insulation film 8. This gate electrode 9 is a composite film composed of a polycrystalline silicon film into which an n-type impurity is introduced to reduce resistance and a film of refractory metal or refractory metal silicide. On the capacitor element C for information storage (with the above-mentioned insulation film 7 interposed) or on the field insulation film 2 is extended the word line (WL) 9 which is formed integrally with the gate electrode 9. The gate electrode 9 and the silicon film, a film of refractory metal, or a film of refractory metal silicide.

The n-type semiconductor region 11 with a low doping density is formed at the side of the channel forming region; it forms the MISFET Q for memory cell selection which is of LDD (Lightly Doped Drain) structure. The semiconductor region 11 is self-aligned to the gate electrode 9. The semiconductor region 13 with a high doping density is self-aligned to the gate electrode 9, with the side wall spacer 12 interposed.

The MISFET Q for memory cell selection may be constructed such that one end connected to the capacitor element C for information storage is made of the n-type semiconductor region 11 and the other end connected to the data line 18 is made up of the n-type semiconductor region 11 and the n+-type semiconductor region with a high doping density which is formed by thermal diffusion.

To the other semiconductor region 13 of the MISFET Q for memory cell selection is connected the data line (DL) 18, with the intermediate conductive film 15 interposed.

One end (the central part) of the intermediate conductive film 15 is connected to the semiconductor region 13 through the connecting hole 14 defined by the side wall spacer 12 formed on the side wall of the gate electrode 9. The other end (the peripheral part) of the intermediate conductive film 15 is lead to the upper part of the gate electrode 9 along the side wall spacer 12. The intermediate film 15 and the gate electrode 9 are electrically separated from each other, with the interlayer insulation film 10 interposed between them.

The intermediate conductive film 15 is a polycrystalline silicon film deposited by the CVD process. It is about 1500-2500 Å thick. It is doped with an n-type impurity in high doping density (in the oversaturated state, for example, $10^{20}$ atoms/cm$^3$) to reduce resistance. The polycrystalline silicon film under the gate electrode 9 of the MISFET Q for memory cell selection is also incorporated with an n-type impurity; however, the intermediate conductive film 15 contains the impurity at a little lower doping density than the gate electrode 9 so that the pn-junction of the semiconductor region 13 is made shallow.

Figure 2:
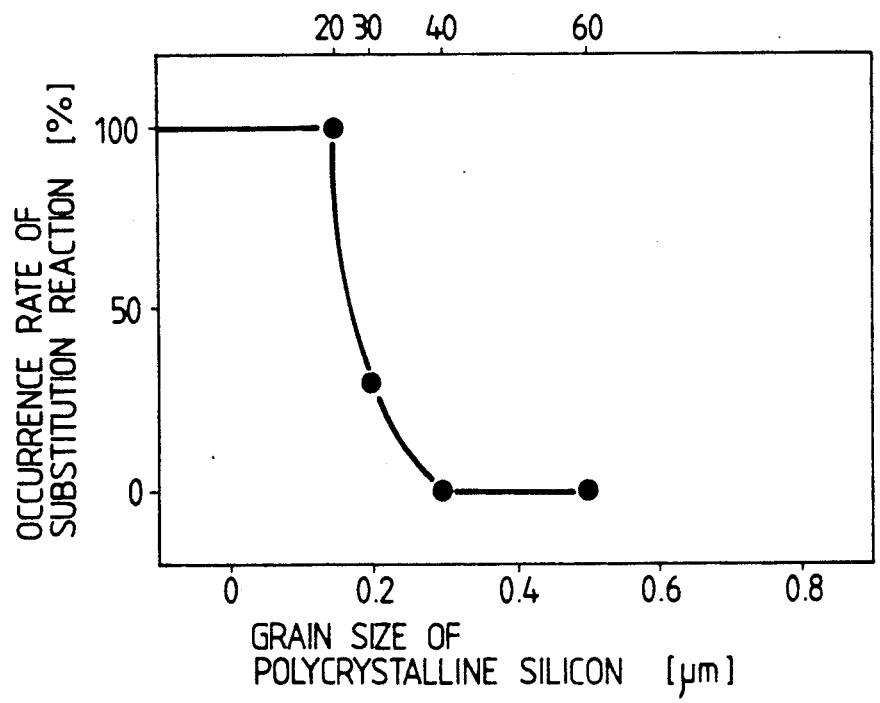
FIG. 2 is a graph showing the dependence of grain size on the substitution reaction.

The intermediate conductive film 15, which is a polycrystalline silicon film, has a grain size larger than 0.1-0.2 μm. (This is the grain size in the flat part; and the grain size in the stepped part is smaller than this.) The grain size in this film is larger than that in the polycrystalline silicon film deposited by the conventional CVD process. The occurrence rate of silicon separating out in the data line 18 in the vicinity of the connection between the intermediate conductive film 15 and the data line 18 depends on the grain size of the intermediate conductive film 15 which is a polycrystalline silicon film, as shown in FIG. 2 which is a graph showing the dependence of the substitution reaction on the grain size. In FIG. 2, the abscissa represents the grain size (μm) in the polycrystalline silicon film at the flat part, and the ordinate represents the ratio (%) of occurrence of the substitution reaction calculated from the number of reactions within the sample number of 40. It is noted from FIG. 2 that the occurrence of the substitution reaction sharply decreases as the grain size of the intermediate conductive film 15 exceeds 0.1-0.2 μm, and that the occurrence of the substitution reaction is almost 0% as the grain size of the intermediate conductive film 15 exceeds 0.3 μm. Therefore, the intermediate conductive film 15 is preferably made of a polycrystalline silicon film having the grain size of 0.1 to 0.2 μm. It is very difficult to produce such a large grain size by the CVD process at 630°-650° C., as explained later in connection with the manufacturing process.

To the surface of the intermediate conductive film 15 is connected the date line (DL) 18 through the connecting hole 17 formed in the interlayer insulation film 16. Although the data line 18 is subject to mask placement errors with respect to the semiconductor region 13 in the manufacturing process, it is possible to connect the data line 18 and the semiconductor region 13 to each other with a self-aligned structure in the narrow region between the gate electrodes 9 by interposing the intermediate conductive film 15, because the central part of the intermediate conductive film 15 is connected to the semiconductor region 13 by self-alignment.

The data line 18 is a composite film formed by putting the shielding film 18A, the aluminum alloy film 18B, and the shielding film 18C on top of the other, as shown in FIG. 1. In other words, the lower surface of the aluminum alloy film 18B of the data line 18 is in contact with the interlayer insulation film 16, with the shielding film 18A interposed between them, and the upper surface of the aluminum alloy film 18B is in contact with the interlayer insulation film 19, with the shielding film 18C interposed between them.

The aluminum alloy film 18B is a film of aluminum (Al) alone or a film of an aluminum alloy containing silicon (Si) and/or copper (Cu). In other words, it is made mainly of aluminum. In this example, the aluminum alloy film 18B is made of Al-0.5 wt % Cu-1.5 wt % Si and has a thickness of about 5000 Å.

The shielding film 18A and the shielding film 18C are made of refractory metal silicide such as $MoSi_2$ or $WSi_2$ and have a thickness of 150–600 Å. The shielding film 18A and the shielding film 18C are so constructed as to prevent the unreacted silicon atoms in the interlayer insulation films 16 and 19 made of silicon from infiltrating into the upper surface and lower surface of the aluminum alloy film 18B. In other words, the shielding film 18A and the shielding film 18C are so constructed as to prevent the infiltration of the silicon atoms which becomes the nuclei for the silicon to separate out in the data line 18. The shielding film 18A and the shielding film 18C, which are made of refractory metal silicide, may have a thickness greater than 600 Å. In this case, the lower shielding film 18A functions as the barrier metal film. In other words, since the signal wiring lines made of the same conductive film as the data line 18 are connected directly to the source region and drain region of the MISFET in the peripheral circuit, the lower shielding film 18A is so constructed as to prevent the growth of an epitaxial layer on this connection, thereby improving the ohmic characteristics of the connection. In addition, the lower shielding film 18A increases the contact resistance in the connection between the data line 18 and the intermediate conductive film 15, if it is excessively thick. Therefore, the lower shielding film 18A should preferably have an adequate thickness of about 150 to 200 Å. In the meantime, the shielding film 18A and the shielding film 18C may be made of $TiSi_2$, TiN, TiO, WN, or the like which is used as the conductive barrier metal.

The data line 18 is used as the signal wiring line in the peripheral circuit (not shown) of the above-mentioned DRAM, and this signal wiring line is connected directly to the semiconductor region, with no intermediate conductive film interposed.

On the data line 18 is formed the shunting word line (WL) 20, with the interlayer insulation film 19 interposed. The shunting word line 20 is connected to the word line 9 in the prescribed region (not shown) and is so constructed as to reduce the resistance of the word line 9. The shunting word line 20 is made mainly of aluminum as in the case of the data line 18.

The insulation film 16 is BPSG (Boron-doped-Phospho-Silicate-Glass) film deposited by the CVD process. The interlayer insulation film 19 is silicon oxide film (or silicon nitride film) deposited by the plasma CVD process or the sputtering process.

As mentioned above, the data line 18 is covered with silicon insulation films (16 and 19), and with the intermediate conductive film (silicon film) 15 interposed to connect to the semiconductor region 13. The shielding films 18A and 18C to shield the silicon atoms of said insulation film are formed at least on and beneath said data line 18. In consequence, it is possible to reduce the resistance of the data line 18, thereby improving the electrical reliability of the DRAM. This is because the shielding films 18A and 18C reduce the silicon atoms in said insulation film which become nuclei for the silicon to separate out in the upper surface or lower surface or inside of said data line 18, and hence reduce the amount of silicon which separates out in said data line 18.

In addition, the data line 18 may be further protected from the infiltration of silicon atoms by forming a shielding film on the side wall of the aluminum alloy film 18B in addition to the shielding films 18A and 18C formed on and beneath the aluminum alloy film 18B, although this adds to the number of manufacturing steps. This shielding film on the side wall of the aluminum alloy film 18B can be formed by depositing a shielding film all over the substrate containing the aluminum alloy film 18B and subsequently performing anisotropic etching (such as RIE) on the shielding film. The shielding film on the side wall of the aluminum alloy film 18B may be formed by plating.

The process for producing the above-mentioned DRAM will be briefly explained in sequence with reference to FIGS. 3 to 10 (which are main part sectional views in each step).

At first, a $p^{31}$-type semiconductor substrate 1 of single crystal silicon is provided. It has a doping density of about $10^{15}$ atoms/$cm^3$.

A field insulation film 2 is formed on the principal surface of the semiconductor substrate 1 within the region in which the memory cell M is formed. The field insulation layer 2 may be an oxide film about 5000 Å thick which is formed by the known selective oxidation process.

Figure 3:
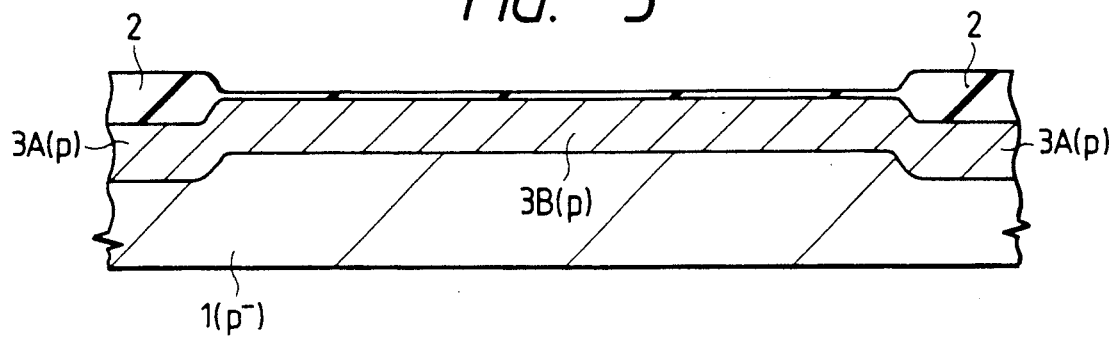
FIGS. 3 to 10 ar main part sectional views in each step of the process for manufacturing the memory cell of DRAM in Embodiment 1 of the invention.

A p-type potential barrier region 3B is formed on the principal surface of the semiconductor substrate 1 within the region in which the memory cell M is formed, and a p-type channel stopper region 3A is formed on the principal surface of the semiconductor substrate 1 within the region in which the memory cell M is formed, as shown in FIG. 3. They can be formed by ion implantation of boron (B) at a doping density of $10^{10-13}$ atoms/$cm^3$ with energy of 200–250 keV.

An $n^+$-type semiconductor region 4 is formed on the principal surface of the p-type potential barrier region 3B within the region in which the capacitor element C for information storage for the memory cell M is formed. This semiconductor region 4 is used as the lower electrode.

A dielectric film 5 is formed on at least the principal surface of said semiconductor region 4. The dielectric film 5 may be a silicon oxide film 100–200 Å thick formed by, for example, the thermal oxidation of the principal surface of said semiconductor region 4.

Figure 4:
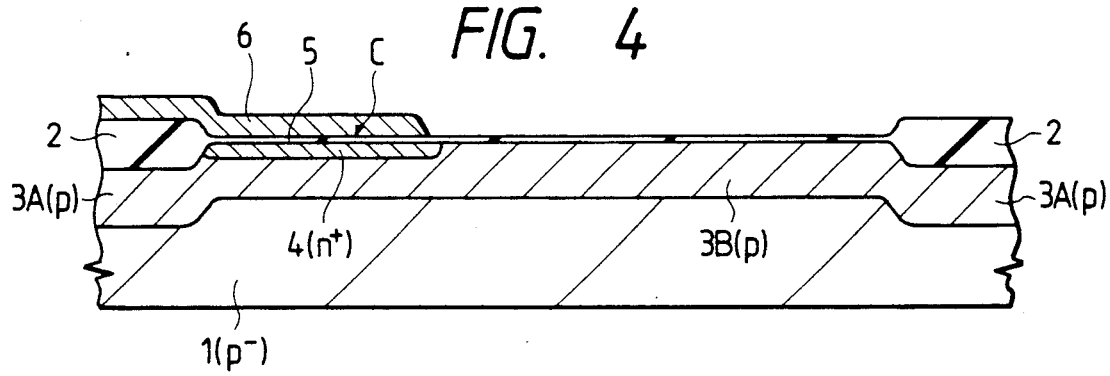

A plate electrode 6 is formed on the dielectric film 4 and the field insulation film 2 in the region outside the region in which the MISFET Q for memory cell selection is formed, as shown in FIG. 4. This plate electrode 6 is used as the upper electrode. The plate electrode 6 is formed by the step of forming the first layer gate wiring line. The capacitor element C is completed when this plate electrode 6 is formed. This plate electrode 6 may be formed by the steps of depositing a polycrystalline silicon film 3000-4000 Å thick by the CVD process, introducing an n-type impurity (such as P) by ion implantation or thermal diffusion for the reduction of resistance, and patterning by anisotropic etching (such as Reactive Ion Etching (RIE)).

An interlayer insulation film 7 is formed on the surface of the plate electrode 6, and a gate insulation film 8 is formed on the principal surface of the potential barrier region 3A within the region in which the MISFET Q for memory cell selection is formed. The interlayer insulation film 7 is a silicon oxide film about 2000 Å thick formed by the thermal oxidation of the surface of the plate electrode 6 (polycrystalline silicon film). The gate insulation film 8 is a silicon oxide film about 200-300 Å thick formed by the thermal oxidation of the principal surface of the potential barrier region 3B.

A gate electrode 9 and an interlayer insulation film 10 are formed on the principal surface of the gate insulation film 8 within the region in which the MISFET Q for memory cell selection is formed. At the same time, a word line 9 and an interlayer insulation film 10 are formed on the interlayer insulation film 7 and the field insulation film 2. The gate electrode 9 and the word line 9 are a composite film formed by putting a refractory metal silicide film 9B on a polycrystalline silicon film 9A. The polycrystalline silicon film 9 is formed by the CVD process and is about 2000-3500 Å thick. The refractory metal silicide film 9B is a $WSi_2$ film about 1000-1500 Å thick formed by sputtering. ($WSi_2$ may be replaced by $TiSi_2$ or $MoSi_2$) The interlayer insulation film 10 is a silicon oxide film about 3000-4000 Å thick formed by the CVD process. The gate electrode 9 and the interlayer insulation film 10 thereon are formed by anisotropic etching (such as RIE). The plate electrode 9 is formed by the step of forming the second layer gate wiring line.

Figure 5:
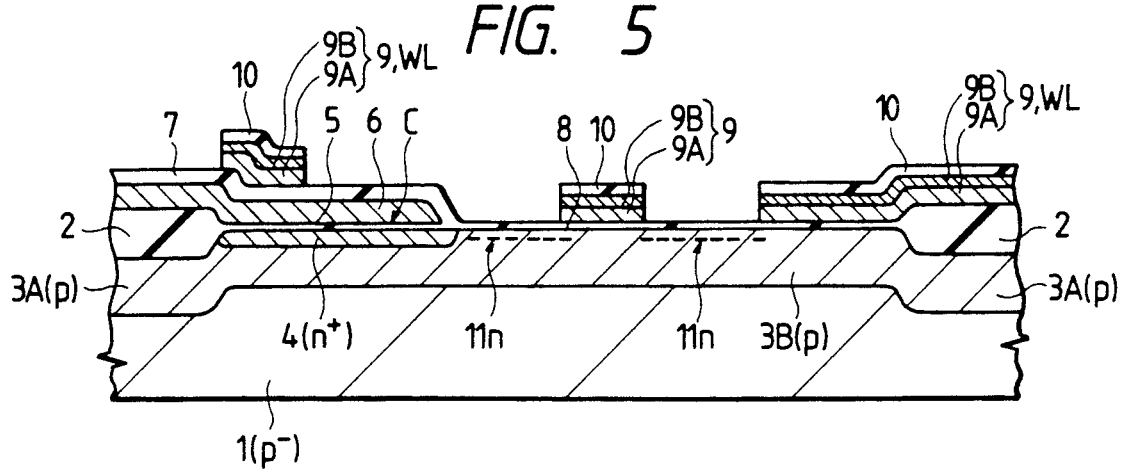

An n-type impurity 11n is introduced into the principal surface of the potential barrier region 3B in the region in which the MISFET Q for memory cell selection is formed, as shown in FIG. 5. The introduction of the n-type impurity 11n may be accomplished by ion implantation of P (or As) using the gate electrode 9 as the mask, at a doping density of about $10^{13-14}$ atoms/cm$^3$ with energy of about 50-100 keV.

A side wall spacer 12 is formed on the respective side walls of the gate electrode 9 and the word line 9. The side wall spacer 12 may be formed by, for example, performing anisotropic etching (such as RIE) on a silicon oxide film deposited by the CVD process.

Figure 6:
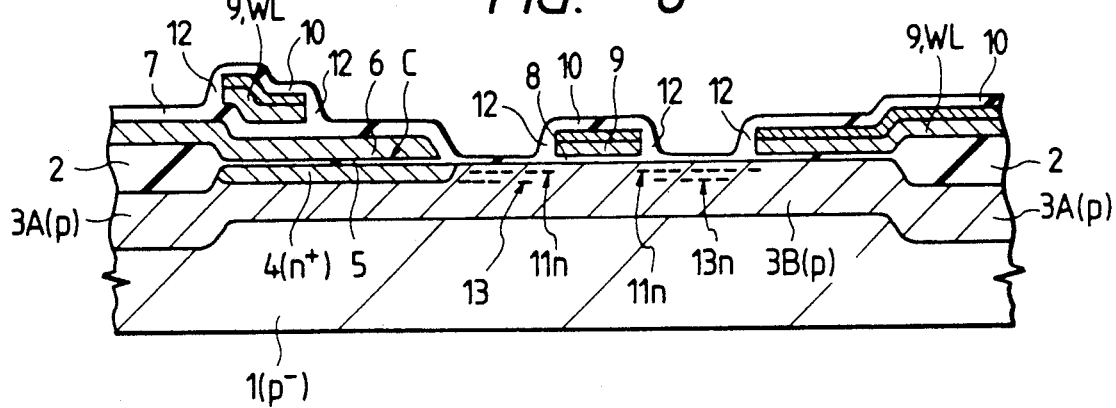

An n-type impurity 13n is introduced into the principal surface of the potential barrier region 3B within the region in which the MISFET Q for memory cell selection is formed, as shown in FIG. 6. The introduction of the n-type impurity 13n may be accomplished by ion implantation of As using the side wall spacer 12 as the mask, at a doping density of about $10^{15-16}$ atoms/cm$^3$ with energy of about 60-100 keV.

A connecting hole 14 is formed within the region in which the other semiconductor region (that side which is connected to the data line 18) of the MISFET Q for memory cell selection is formed. The connecting hole 14 may be formed by removing the insulation film on the potential barrier region 3B by anisotropic etching (such as RIE) using an etching mask (such as photoresist film) and also using the side wall spacer 12 as a mask.

Figure 7:
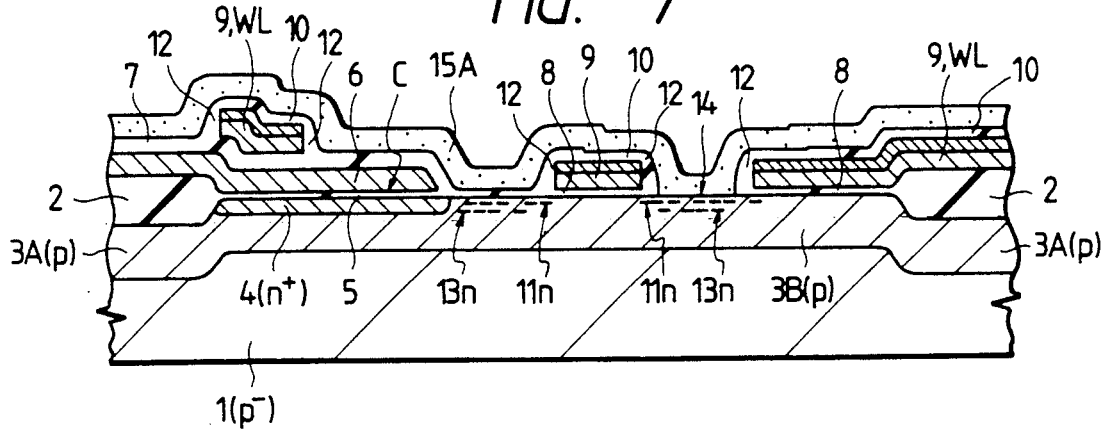

An amorphous silicon film 15A is deposited all over the substrate including the interlayer insulation film 10, so that it comes into contact with the potential barrier region 3B through the connecting hole 14, as shown in FIG. 7. The amorphous silicon film 15A is about 1500-2500 Å thick, and it is deposited by, for example, the CVD process. The silicon film deposited on the surface of single crystal silicon varies in crystal structure depending on the temperature chosen in the CVD process. A polycrystalline silicon film is deposited at 625°-900° C., and a single crystal silicon film is deposited (by epitaxial growth) at 900° C. and above. A silicon film containing a polycrystalline silicon and amorphous silicon is deposited at the temperature about 580°-625° C. The temperatures in this range (580°-625° C.) are not used because the resulting crystal structure are unstable. Therefore, the deposition of polycrystalline silicon film by the CVD process is usually accomplished at 625°-900° C. The amorphous silicon film 15A is deposited by the CVD process at 600° C. or below, with a certain margin taken into account. This amorphous silicon film 15A is formed by the step of forming the third layer gate wiring line. The technology for forming a polycrystalline silicon film by the CVD process is described in "MOSLSI Manufacturing Technology" (p. 110-112), 1985, Nikkei-McGraw Hill.

The amorphous silicon film 15A is treated for the reduction of resistance. This treatment may be accomplished by introducing an n-type impurity (P or As) into the amorphous silicon film 15A by ion implantation or solid phase diffusion (thermal diffusion) and then activating this impurity by annealing (first heat treatment) at 870°-880° C. for about 10 minutes. The ion implantation for P may be accomplished at a doping density of about $10^{15}$ atoms/cm$^3$ with energy of 60-100 keV.

The amorphous silicon film 15A undergoes patterning by anisotropic etching (such as RIE). Thus there is formed the intermediate conductive film 15 in which the amorphous structure is slightly changed into the polycrystalline structure by the treatment for the reduction of resistance.

Figure 8:
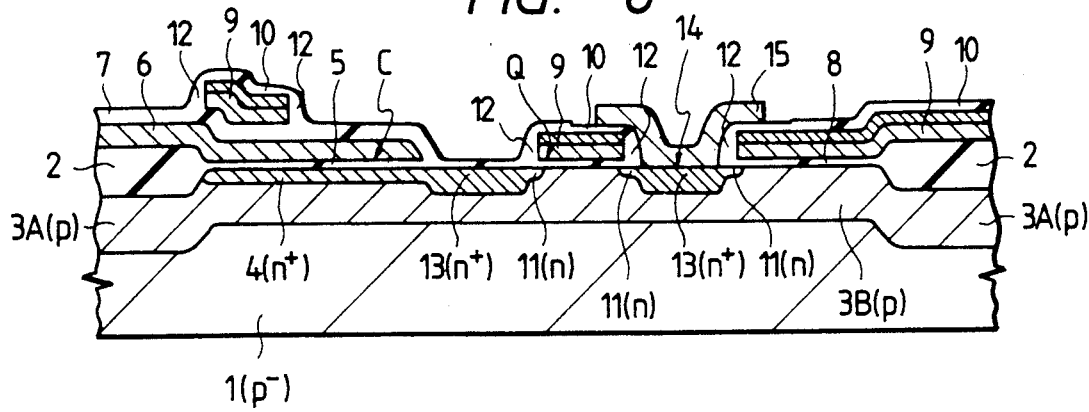
Figure 9:
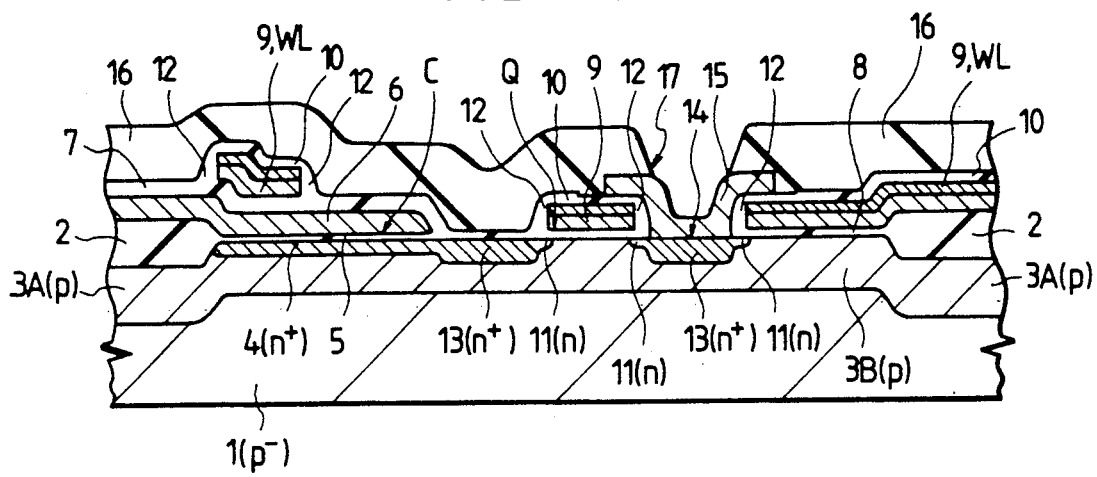

Next, as shown in FIG. 8, the entire surface of the substrate undergoes annealing (second heat treatment), and an n-type semiconductor region 11 is formed by performing drive-in diffusion on the previously introduced n-type impurity 11n and an n+-type semiconductor region 13 is formed by performing drive-in diffusion on the n-type impurity 13n. The second heat treatment is carried out at about 950° C. for about 30 minutes. The MISFET Q for memory cell selection is completed as the semiconductor regions 11 and 13 are formed. More polycrystalization of intermediate conductive film 15 is formed and grain size of polycrystalline silicon further grows.

An interlayer insulation film 16 is formed all over the substrate including the intermediate conductive film 15. The interlayer insulation film 16 may be a BPSG film (5000-9000 Å thick) deposited by the CVD process.

The interlayer insulation film 16 is removed and the connecting hole 17 is formed on the intermediate conductive film 15.

The interlayer insulation film 16 is subjected to glass flow (third heat treatment) to smoothen the surface of the interlayer insulation film 16. Glass flow should be performed at about 950° C. for about 30 minutes. Glass flow enlarges further the grain size in the intermediate conductive film 15. The treatment for the reduction of resistance, the drive-in diffusion, and the heat-treatment such as glass flow form grains in the amorphous silicon film 15A and cause them to grow until the grain size exceeds 0.1–0.2 μm. In this way there is formed the polycrystalline intermediate conductive film 15.

Figure 10:
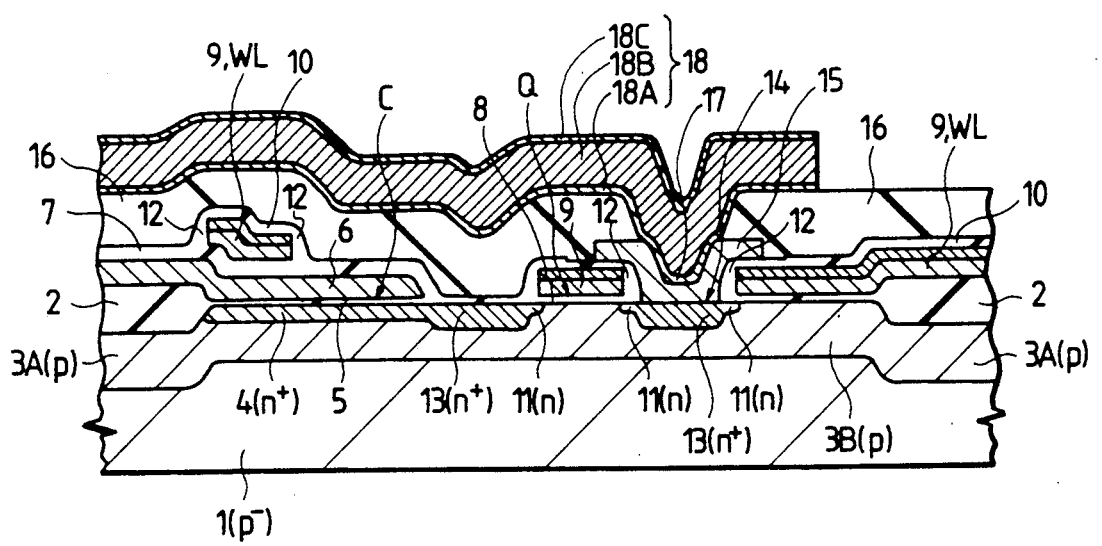

A data line 18 is formed on the interlayer insulation film 16 so that it comes into contact with the surface of the intermediate conductive film 15 though the connecting hole 17, as shown in FIG. 10. The data line 18 may be formed by putting a shielding film 18A, aluminum alloy film 18B, and shielding film 18C by sputtering in layers, and then patterning these layers. After the data line 18 shown in FIG. 10 has been formed, an interlayer insulation film 19 is formed on the entire surface including the data line 18. The interlayer insulation film 19 may be a silicon oxide film deposited by plasma CVD or sputtering.

A shunting word line 20 is formed on the interlayer insulation film 19, as shown in FIG. 1. The shunting word line 20 may be made of Al-0.5 wt % Cu-1.5 wt % Si alloy. Finally, a passivation film (not shown) is formed on the shunting word line 20. The DRAM in Embodiment 1 is completed by the series of manufacturing steps as mentioned above.

As mentioned above, the intermediate conductive film 15 is a polycrystalline silicon film having a large grain size which is formed by depositing the amorphous silicon film 15A and then subjecting it to heat treatment as mentioned above.

In the case of polycrystalline silicon film deposited by CVD, the grain size is smaller than about 0.1 μm. To enlarge the grain size in the polycrystalline silicon film deposited by CVD, high temperature heat treatment (higher than 1000° C.) is necessary which would form single crystals.

The intermediate conductive film 15 undergoes the treatment for the reduction of resistance, the drive-in diffusion, and the heat treatment such as glass flow, after the deposition of the amorphous silicon film 15A and before the formation of the data line 18, so that polycrystals are formed and their grain size is enlarged. In other words, other steps can be utilized for forming polycrystals in the intermediate conductive film 15 and enlarging the grain size of polycrystals, and this reduces the number of steps for the fabrication of a DRAM.

According to above described Embodiment, in a DRAM in which the data line 18 is connected to the semiconductor region 13 with the intermediate conductive film (polycrystalline silicon film) 15 interposed, the amorphous silicon film 15A is deposited and it is subjected to heat treatment to form the intermediate conductive film 15 of polycrystalline structure. In consequence, this makes the grain size in the intermediate conductive film 15 larger than 0.1–0.2 μm. The intermediate conductive film 15 having the large grain size stabilizes the grain boundary energy, so that the silicon atoms in the intermediate conductive film 15 do not readily dissolve in the data line 18 and the amount of silicon which separates out in the data line 18 is reduced. As the result, it is possible to reduce the amount of silicon which separates out in the data line 18 in the vicinity of the connection between the intermediate conductive film 15 and the data line 18. Therefore, it is possible to lower the resistance of the data line 18 or prevent the breakage of the data line 18, thereby improving the electrical reliability of a DRAM.

It is also possible to produce the same effect as mentioned above by depositing the intermediate conductive film 15 by CVD at a temperature lower than 600° C. and then subjecting it to heat treatment which forms polycrystals.

In a DRAM having the data line 18, covered with silicon insulation films (16 and 19) and with the intermediate conductive film (silicon film) 15 interposed, connected to the semiconductor region 13, the amorphous silicon film 15A is deposited and it is subjected to heat treatment to form the intermediate conductive film 15 of polycrystalline structure, and the shielding films 18A and 18C to shield the silicon atoms in the insulation film are formed on at least the lower surface and upper surface of the data line 18. In consequence, it is possible to improve the electrical reliability of the DRAM.

Embodiment 2

Figure 11:
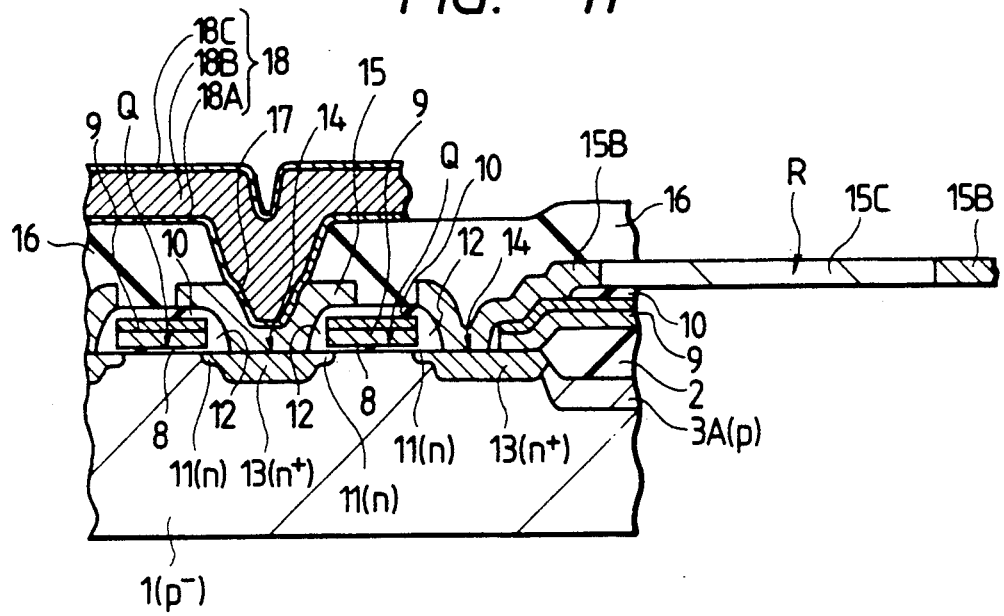
FIG. 11 is a main part sectional view of a semiconductor integrated circuit device containing the memory cell of SRAM in Embodiment 2 of the invention.

In this Embodiment, the present invention is applied to the high-resistance load-type memory cell of a SRAM, the construction and major parts of which are shown in section in FIG. 11.

The high-resistance load-type memory cell is made up of a flip-flop circuit (information storage unit) and MISFETs Q for transfer connected to a pair of input-output terminals of the flip-flop circuit. The flip-flop circuit is made up of two MISFETs for driving and two high-resistance elements R.

FIG. 11 shows the MISFETs Q for transfer and the high-resistance element R for the high-resistance load-type memory cell.

The MISFET Q for transfer has substantially the same structure as that of the MISFET for memory cell selection in Embodiment 1. One of the semiconductor regions 13 of the MISFET Q for transfer is connected to the data line 18, with the intermediate conductive film 15 interposed. The other semiconductor region 13 of the MISFET Q for transfer is connected to the high-resistance element R, with the conductir film 15B interposed.

The conductive film 15B is formed by treating the amorphous silicon film 15A for the reduction of resistance and converting the amorphous structure into the polycrystalline structure, in the same manner as for the intermediate conductive film 15.

The high-resistance element R is the polycrystalline silicon film 15C which is formed by heat-treating the amorphous silicon film 15A. (The amorphous silicon film 15A does not undergo treatment for the reduction of resistance and the introduction of n-type impurity.) In other words, the high-resistance element R is formed by masking (with a photoresist film or silicon oxide film deposited by CVD) the amorphous silicon film 15B when an n-type impurity is introduced for the treatment for the reduction of resistance.

Thus, the intermediate conductive film 15, the conductive film 15B, and the high-resistance element R (polycrystalline silicon film 15C) are formed by the same fabricating step.

The process for producing the conductive film 15B and the high-resistance element R will be briefly described in sequence.

The SRAM has, in the first region, the semiconductor region 13 and the data line 18, with the intermediate conductive film 15 interposed, and also has the high-resistance element R in the second region. At first, the amorphous silicon film 15A is formed on the entire surface of the substrate including the first and second regions, in the same manner as in Embodiment 1.

A photoresist mask resistant to the introduction of impurity is formed by the known technique on the region in which the high-resistance element R is formed.

The amorphous silicon film 15A undergoes treatment for the reduction of resistance, in the same manner as in Embodiment 1. During this treatment, the high-resistance element R can be formed owing to the mask (resistant to the introduction of impurity) formed on the amorphous silicon film 15B.

The conductive film 15B and the intermediate conductive film 15 are formed by treating the amorphous silicon film 15A for the reduction of resistance, thereby converting the amorphous structure into the polycrystalline structure.

According to above described Embodiment, it is possible to produce the same effect as in Embodiment 1 in the SRAM which has, in the first region, the semiconductor region 13 and the data line 18, with the intermediate conductive film 15 interposed, and also has the high-resistance element R in the second region, the amorphous silicon film 15A is deposited in the first and second regions, the amorphous silicon film 15A in the first region undergoes treatment for the reduction of resistance, so that the amorphous structure is converted into the polycrystalline structure (to form the intermediate conductive film 15) and simultaneously the high-resistance element R is formed from the amorphous silicon film 15A in the second region. It is also possible to reduce the number of steps for fabricating the SRAM because the high-resistance element R (polycrystalline silicon film 15C) can also be formed from the amorphous silicon film 15A from which the intermediate conductive film 15 is formed.

Embodiment 3

Figure 12:
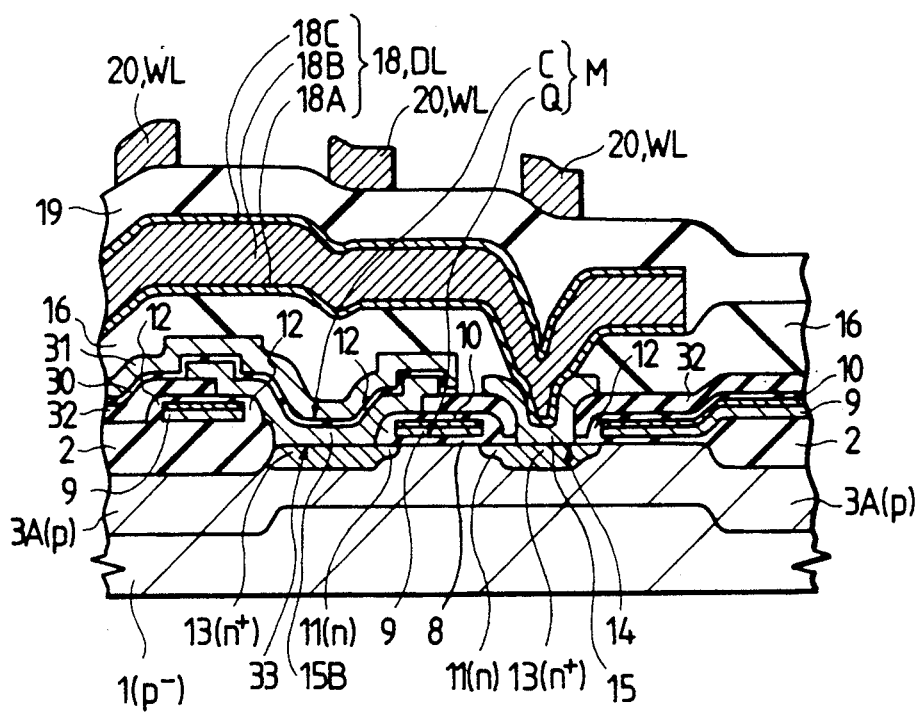
FIG. 12 is a main part sectional view of a semiconductor integrated circuit device containing the memory cell of DRAM in Embodiment 3 of the invention.

In this Embodiment, the present invention is applied to the semiconductor integrated circuit as mentioned in Embodiment 1 which has the capacitor element of stacked structure for information storage for the memory cell of the DRAM. The memory cell of the DRAM is constructed as shown in FIG. 12 (which is a main part sectional view).

The memory cell M of the DRAM is made up of the MISFET Q for memory cell selection and the capacitor element C of stacked structure for information storage which are connected in series.

The MISFET Q for memory cell selection is made of the same gate electrode material 9 as used for the gate electrode formed in the step of forming the second layer gate wiring line in Embodiment 1.

The capacitor element C for information storage is made up of the plate electrode (lower electrode) 15B, the dielectric film 30, and the plate electrode 31 laid one on top of the other. The plate electrode 13 is connected to that side of the $n^{30}$-type semiconductor region 13 which is not connected to the data line of the MISFET Q for memory cell selection. This connection is made through the connecting hole 33 formed on the interlayer insulation film 32 and also defined by the said wall spacer 12. The plate electrode 15B is formed by treating the amorphous silicon film 15A for the reduction of resistance, thereby converting the amorphous structure into the polycrystalline structure, in the same manner as for the intermediate conductive film 15. In other words, it is formed in the step for producing the intermediate conductive film 15. The dielectric film 30 is a single film or film of silicon oxide film, silicon nitride film, an oxide film formed by CVD or sputtering which is used for the formation of insulation film. The plate electrode 31 is a polycrystalline silicon film which been doped with an n-type impurity.

The DRAM has the peripheral circuit such as a decoder circuit (not shown) which is made up CMOS as in Embodiment 1.

The process for producing the DRAM in this Embodiment is briefly described in sequence.

At first, the side wall spacer 12 is formed on the respective side walls of the gate electrode 9 and the word line 9, and then the interlayer insulation film 32 is formed. The interlayer insulation film 32 is a silicon oxide film 2000–4000 Å thick formed by, for example, the CVD process.

The connecting holes 14 and 33 are formed, and then the amorphous silicon film 15A is formed on the entire surface of the substrate including the connecting holes 14 and 33.

The amorphous silicon film 15A is subjected to patterning and treatment for the reduction of resistance in the same manner as in Embodiment 1, so that the intermediate conductive film 15 and the plate electrode 15B are formed in which the amorphous structure has slightly changed into the polycrystalline structure.

Thus the intermediate conductive film 15 and the plate electrode 15B are formed in the same step of fabrication.

The dielectric film 30 (silicon oxide film) is formed by the CVD process, and the plate electrode 31 is formed on the dielectric film 30.

The dielectric film 30 may be a composite film composed of a silicon oxide film and a silicon nitride film.

The plate electrode 31 is a 2000–4000 Å thick polycrystalline silicon film containing an n-type impurity formed by the CVD process.

The capacitor element C of stacked structure for information storage is formed by patterning.

Finally, the interlayer insulation film 16, the data line 18, the interlayer insulation film 19, and the word line 20 for shunting are formed in the same manner as in Embodiment 1.

According to the above-described embodiment, it is possible to produce the same effect as in Embodiment 1 in the DRAM which has the capacitor element of stacked structure for information storage, with the data line 18 connected to the semiconductor region 13, with the intermediate conductive film 15 interposed, the amorphous silicon film 15A is deposited and the amorphous silicon film 15A undergoes treatment to form the polycrystalline intermediate film 15 and simultaneously to form the plate electrode 15B of the capacitor element C of stacked structure for information storage. It is also possible to reduce the number of steps for fabricating the DRAM because the plate electrode 15B is formed from the amorphous silicon film 15A from which the intermediate conductive film 15 is also formed.

In this Embodiment, the intermediate conductive film 15 is formed in the same step as for the plate electrode 15B which is the lower electrode of the capacitor element C of stacked structure for information storage. The invention is not limited to this. The intermediate conductive film 15 may be formed in the same step as for the plate electrode 31 which is the upper electrode of the capacitor element C of stacked structure for information storage.

The typical effects produced by the present invention are briefly explained in the following.

(1) In the semiconductor integrated circuit device having the wiring line covered with a silicon insulation film and connected to the semiconductor region, with a silicon film interposed, the shielding film to shield the silicon atoms of said insulation film is formed on at least the lower surface and upper surface of said wiring line. This construction reduces the amount of silicon atoms which come from said insulation film to become the nuclei for silicon atoms to separate out in the upper surface or lower surface or inside of said wiring line. Therefore, it reduces the resistance of said wiring line or prevents the breakage of said wiring line, thereby improving the electrical reliability of the semiconductor integrated circuit.

(2) Said silicon film is formed in the amorphous state, and subsequently it is changed into the polycrystalline silicon film by heat treatment. This produces not only the same effect as in (1) above but also the effect of enlarging the grain size of said silicon film and stabilizing the grain boundary energy, making silicon atoms in said silicon film sparingly soluble in said wiring line and reducing the amount of silicon which separates out in said wiring line. As the result, it is possible to reduce the amount of silicon which separates out in the wiring line in the vicinity of the connection between said silicon film and wiring line. Therefore, it is possible to lower the resistance of said wiring line or prevent the breakage of said wiring line, thereby improving the electrical reliability of the semiconductor integrated circuit. (3) In the semiconductor integrated circuit device having the wiring line connected to the semiconductor region, with a silicon film interposed, the silicon film is deposited in the amorphous state, and subsequently it undergoes heat treatment so that the amorphous structure is changed into the polycrystalline structure and the grain size is increased. Since the other step can be utilized for increasing the grain size, it is possible to reduce the number of steps accordingly in the fabrication of the DRAM.

(4) In the semiconductor integrated circuit device having the wiring line connected to the semiconductor region, with a silicon film interposed, the silicon film is made to have the polycrystalline structure by heat treatment. This produces substantially the same effect as in (3) mentioned above.

(5) In the semiconductor integrated circuit device having, in the first region, a silicon film interposed between the semiconductor region and the wiring line, and also having a high resistance element R in the second region, the amorphous silicon film is deposited in the first and second regions, and the silicon film in the first region undergoes treatment for the reduction of resistance so that it has the polycrystalline structure and the silicon film in the second region is made into the high-resistance element. This produces not only the same effect as in (3) mentioned above but also the effect of reducing the number of steps for fabricating the semiconductor integrated circuit device because the high-resistance element can be formed in the step for forming the silicon film interposed between the semiconductor region and the wiring line.

(6) In the semiconductor integrated circuit device having, in the first region, a silicon film interposed between the semiconductor region and the wiring line, and also having a plate electrode in the second region, the amorphous silicon film is deposited in the first and second regions, and the silicon film in the first region undergoes treatment for the reduction of resistance so that it has the polycrystalline structure and the silicon film in the second region is made into the plate electrode. This produces not only the same effect as in (3) mentioned above but also the effect of reducing the number of steps for fabricating the semiconductor integrated circuit device because the plate electrode can be formed in the step for forming the silicon film interposed between the semiconductor region and the wiring line.

Although the invention has been described in its preferred form, it is to be understood that the invention is not limited to the above-mentioned embodiments but various changes and modifications may be made without departing from the spirit and scope thereof. For example, the invention may be applied to not only DRAM and SRAM but also semiconductor integrated circuits having MISFETs and bipolar transistors. In other words, the present invention may be applied to any semiconductor integrated circuit in which the wiring line is connected to the semiconductor region (source region, drain region, emitter region, base region, collector region, etc.), with a silicon film interposed.

What is claimed is:

1. A method of manufacturing a semiconductor integrated circuit device, said method comprising: a step of forming a first semiconductor film in an amorphous state on one of source and drain regions of a MISFET in a semiconductor region on a semiconductor substrate; a step of performing heat-treatment on said first semiconductor film in the amorphous state, thereby changing the amorphous state into a polycrystalline state, crystal grains of the first semiconductor film in the polycrystalline state being sufficiently large so as to reduce a substitution reaction between semiconductor material of the first semiconductor film and aluminum, as compared to the substitution reaction where the crystal grains are smaller; and a step of forming a first wiring line, of an aluminum film, on the first semiconductor film in the polycrystalline state, wherein said first wiring line is connected to said first semiconductor film in the polycrystalline state on one of the source and drain regions of said MISFET of said semiconductor region.

2. A method of manufacturing a semiconductor integrated circuit device according to claim 1, wherein said first semiconductor film in amorphous state is an amorphous silicon film formed by CVD at a temperature lower than 600° C.

3. A method of manufacturing a semiconductor integrated circuit device according to claim 1, wherein said first semiconductor film becomes, after heat treatment step in the manufacturing process, a polycrystalline semiconductor film which is composed of crystal grains larger than 0.1 μm.

4. A method of manufacturing a semiconductor integrated circuit device according to claim 3, wherein the polycrystalline semiconductor film is a polycrystalline silicon film.

5. A method of manufacturing a semiconductor integrated circuit device according to claim 1, wherein said first wiring line is provided on the upper and lower surfaces thereof with a shielding film which is a film of high-melting metal.

6. A method of manufacturing a semiconductor integrated circuit device according to claim 1, wherein said first wiring line is an aluminum alloy film.

7. A method of manufacturing a semiconductor integrated circuit device according to claim 1, wherein said semiconductor region contains a capacitor connected to said MISFET in series.

8. A method of manufacturing a semiconductor integrated circuit device according to claim 1, wherein said first wiring line and said one of source and drain regions of said MISFET are connected to each other in a region which is self-aligned to a gate electrode of said MISFET and defined by a side wall of said gate electrode.

9. A method of manufacturing a semiconductor integrated circuit device according to claim 1, wherein said first semiconductor film is formed by chemical vapor deposition, with a thickness of 1500–2500 Å.

10. A method of manufacturing a semiconductor integrated circuit device according to claim 1, wherein the grain size of the polycrystalline state of the first semiconductor film is greater than 0.2 μm.

11. A method of manufacturing a semiconductor integrated circuit device according to claim 10, wherein said grain size is greater than 0.3 μm.

12. A method of manufacturing a semiconductor integrated circuit device according to claim 1, wherein the aluminum film is made of aluminum alone or of an aluminum alloy.

13. A method of manufacturing a semiconductor integrated circuit device according to claim 12, wherein the aluminum alloy contains at least one of silicon and copper.

14. A method of manufacturing a semiconductor integrated circuit device according to claim 1, wherein the step of forming the first semiconductor film includes introducing an impurity so as to lower resistance of the first semiconductor film as compared to the resistance thereof without the impurity.

15. A method of manufacturing a semiconductor integrated circuit device according to claim 14, wherein the heat treatment includes at least one annealing treatment to lower resistance of the first semiconductor film and to form the source and drain region.

16. A method of manufacturing a semiconductor integrated circuit device according to claim 1, wherein the heat treatment includes at least one annealing treatment.

17. A method of manufacturing a semiconductor integrated circuit device according to claim 1, wherein said first semiconductor film, in said amorphous state, is also provided on a part of the semiconductor substrate other than said one of source and drain regions of said MISFET, so as to provide another portion of said first semiconductor film, said another portion also being heat-treated so as to change into the polycrystalline structure.

18. A method of manufacturing a semiconductor integrated circuit device according to claim 17, wherein said another portion is provided on the semiconductor substrate at a location of a capacitor of the semiconductor integrated circuit device, the another portion forming a lower electrode of the capacitor.

19. A method of manufacturing a semiconductor integrated circuit device according to claim 17, wherein said another portion is provided in electrical contact with the other of the source and drain regions of said MISFET, and wherein said another portion forms a resistance element of the semiconductor integrated circuit device.

20. A method of manufacturing a semiconductor integrated circuit device according to claim 17, wherein said device has at least two semiconductor regions provided in the semiconductor substrate, wherein said another portion is provided in electrical contact with another semiconductor region of said at least two semiconductor regions, and wherein said another portion forms a resistance element of the semiconductor integrated circuit device.

21. A method of manufacturing a semiconductor integrated circuit device including a semiconductor region having a MISFET and a resistance element connected to said MISFET, said method comprising: a step of forming a first semiconductor film in an amorphous state simultaneously on first and second regions of said semiconductor region in a semiconductor substrate; a step of selectively introducing an impurity into said first semiconductor film, in the first region and not in the second region, in the amorphous state; a step of performing heat treatment on said first semiconductor film in the amorphous state, said first semiconductor film changing from the amorphous state into a polycrystalline state; crystal grains of the first semiconductor film in the polycrystalline state being sufficiently large so as to reduce a substitution reaction between semiconductor material of the first semiconductor film and aluminum, as compared to the substitution reaction where the crystal grains are smaller; and a step of forming a first wiring line, of aluminum, on said first semiconductor film in said first region; wherein said resistance element made of said first semiconductor film in the polycrystalline state is formed in said second region, and said first wiring line is connected to said first semiconductor film in the polycrystalline state on one of source and drain regions of said MISFET in the first region.

22. A method of manufacturing a semiconductor integrated circuit device according to claim 21, wherein said resistance element and said MISFET constitute an SRAM.

23. A method of manufacturing a semiconductor integrated circuit device according to claim 21, wherein the heat treatment is performed such that the first semiconductor film is changed into the polycrystalline state having crystal grains that are sufficiently large so as to reduce a substitution reaction between semiconductor material of the first semiconductor film and aluminum, as compared to the substitution reaction where the crystal grains are smaller.

24. A method of manufacturing a semiconductor integrated circuit device including a semiconductor region having a MISFET and a capacitance connected to said MISFET, said method comprising: a step of forming a first semiconductor film in an amorphous state simultaneously on first and second regions of the semiconductor region in a semiconductor substrate; a step of introducing an impurity into the first semiconductor film, in both the first and second regions, in the amorphous state; a step of performing heat-treatment on said first semiconductor film in the amorphous state, the first semiconductor film changing from the amorphous state into a polycrystalline state; crystal grains of the first semiconductor film in the polycrystalline state being sufficiently large so as to reduce a substitution reaction between semiconductor material of the first semiconductor film and aluminum, as compared to the substitution reaction where the crystal grains are smaller; and a step of forming a first wiring line, of aluminum, on the first semiconductor film in the first region, wherein the first semiconductor film on the second region is an electrode of said capacitor, and said first wiring line is connected to the first semiconductor film on one of source and drain regions of said MISFET in the first region.

25. A method of manufacturing a semiconductor integrated circuit device according to claim 24, wherein said MISFET and said capacitor constitute a memory cell of a DRAM.

26. A method of manufacturing a semiconductor integrated circuit device having at least one semiconductor region provided in a semiconductor substrate, comprising: a step of forming a first semiconductor film in an amorphous state on a semiconductor region of said integrated circuit device; a step of performing heat-treatment on said first semiconductor film in the amorphous state, thereby changing the amorphous state into a polycrystalline state, the crystal grains of the first semiconductor film in the polycrystalline state being sufficiently large so as to reduce a substitution reaction between semiconductor material of the first semiconductor film and aluminum, as compared to the substitution reaction where the crystal grains are smaller; and a step of forming a first wiring line, of aluminum, on the first semiconductor film in the polycrystalline state, wherein the first wiring line is connected to said first semiconductor film in the polycrystalline state on said semiconductor region of said integrated circuit device.

27. A method of manufacturing a semiconductor integrated circuit device according to claim 26, wherein the first semiconductor film in the polycrystalline state has crystal grains larger than 0.1 $\mu$m.

28. A method of manufacturing a semiconductor integrated circuit device according to claim 26, wherein the first semiconductor film is a silicon film.

29. A method of manufacturing a semiconductor integrated circuit device according to claim 26, wherein said first semiconductor film, in said amorphous state, is also provided on a part of the semiconductor substrate other than said semiconductor region, so as to provide another portion of said first semiconductor film, said another portion also being heat-treated so as to change into the polycrystalline structure.

30. A method of manufacturing a semiconductor integrated circuit device according to claim 29, wherein said another portion is provided on the semiconductor substrate at a location of a capacitor of the semiconductor integrated circuit device, the another portion forming a lower electrode of the capacitor.

* * * * *